US006603367B2

(12) United States Patent
Pao et al.

(10) Patent No.: US 6,603,367 B2
(45) Date of Patent: Aug. 5, 2003

(54) VOLTAGE CONTROLLED OSCILLATORS INCLUDING TUNABLE DIELECTRIC DEVICES

(75) Inventors: Douglas Pao, Ellicott City, MD (US); Louise C. Sengupta, Ellicott City, MD (US)

(73) Assignee: Paratek Microwave, Inc., Columbia, MD (US)

( * ) Notice: Subject to any disclaimer, the term of this patent is extended or adjusted under 35 U.S.C. 154(b) by 0 days.

(21) Appl. No.: 09/908,960

(22) Filed: Jul. 19, 2001

(65) Prior Publication Data

US 2002/0060613 A1 May 23, 2002

Related U.S. Application Data

(60) Provisional application No. 60/219,567, filed on Jul. 20, 2000.

(51) Int. Cl.$^7$ .................................................. H03B 1/00
(52) U.S. Cl. ............................. 331/177 V; 331/117 D; 331/107 SL; 331/107 DP; 331/96; 333/219.1
(58) Field of Search ...................... 331/107 SL, 107 DP, 331/177 V, 96, 117 D; 333/219.1

(56) References Cited

U.S. PATENT DOCUMENTS

| 4,325,035 A | | 4/1982 | Nishikawa et al. |
| 4,630,004 A | * | 12/1986 | Niehenke et al. ....... 331/107 SL |
| 4,639,690 A | | 1/1987 | Lewis |
| 4,712,078 A | | 12/1987 | Slobodnik, Jr. et al. |
| 4,713,632 A | | 12/1987 | Nishikawa et al. |

(List continued on next page.)

FOREIGN PATENT DOCUMENTS

EP 0125586 A 11/1984

OTHER PUBLICATIONS

U.S. patent application Ser. No. 09/419,126, Sengupta et al., filed Oct. 15, 1999.
U.S. patent application Ser. No. 09/434,433, Sengupta et al., filed Nov. 4, 1999.
U.S. patent application Ser. No. 09/594,837, Chiu et al., filed Jun. 15, 2000.
U.S. patent application 09/644,019, Kozyrev et al., filed Aug. 22, 2000.
U.S. patent application Ser. No. 09/660,309, Zhu et al., filed Sep. 12, 2000.
U.S. patent application Ser. No. 09/768,690, Sengupta et al., filed Jan. 24, 2001.
U.S. patent application Ser. No. 09/847,254, Osadchy et al., filed May 2, 2001.
U.S. patent application Ser. No. 09/882,605, Sengupta, filed Jun. 15, 2001.

(List continued on next page.)

*Primary Examiner*—Arnold Kinkead
(74) *Attorney, Agent, or Firm*—Robert P. Lenart; William J. Tucker

(57) ABSTRACT

A voltage controlled oscillator includes an active element having a first connection point for connection to a voltage source and an output connection point. A tunable resonator including a first voltage tunable dielectric device is connected to an input of the active element. A first circuit branch is also connected to the active element. The first circuit branch can include a second voltage tunable dielectric device. A tuning voltage controller supplies a control voltage to the first and second voltage tunable dielectric devices to control the frequency of an oscillating voltage at the output connection point. In a reflect type voltage controlled oscillator, the first circuit branch is a bypass circuit. In a transmission type voltage controlled oscillator, the first circuit branch includes a phase shifter and is connected between the active element output connection point and the tunable resonator.

31 Claims, 4 Drawing Sheets

U.S. PATENT DOCUMENTS

| | | | |
|---|---|---|---|
| 4,769,620 A | | 9/1988 | Nicotra |
| 5,032,800 A | * | 7/1991 | Galani et al. ............... 331/1 R |
| 5,233,319 A | | 8/1993 | Mizan et al. |
| 5,373,264 A | | 12/1994 | Higgins, Jr. |
| 5,427,988 A | | 6/1995 | Sengupta et al. |
| 5,578,969 A | | 11/1996 | Kain |
| 5,635,433 A | | 6/1997 | Sengupta |
| 5,635,434 A | | 6/1997 | Sengupta |
| 5,693,429 A | | 12/1997 | Sengupta et al. |
| 5,766,697 A | | 6/1998 | Sengupta et al. |
| 5,830,591 A | | 11/1998 | Sengupta et al. |
| 5,846,893 A | | 12/1998 | Sengupta et al. |
| 5,982,244 A | | 11/1999 | Fujisaki |
| 6,041,083 A | | 3/2000 | Larsson et al. |
| 6,074,971 A | | 6/2000 | Chiu et al. |
| 6,161,003 A | | 12/2000 | Lo Curto et al. |
| 6,172,577 B1 | | 1/2001 | Oe et al. |
| 6,297,704 B1 | * | 10/2001 | Nicholls et al. ............... 331/34 |

OTHER PUBLICATIONS

U.S. application No. 60/295,046, Luna et al., filed Jun. 1, 2001.

K. Tajima et al., "A 5 to 10 GHz Low Spurious Triple Tuned Type PLL Synthesizer Driven by Frequency Converted DDS Unit," *1997 IEEE MTT–S International Microwave Symposium Digest*, Denver, Jun. 8–13, 1997, *IEEE MTT–S International Microwave Symposium Digest*, New York *IEEE*, US, vol. 3, Jun. 8, 1997, pp. 1217–1220.

D. Young et al., "A Low–Noise RF Voltage–Controlled Oscillator Using On–Chip High–Q Three–Dimensional Coil Inductor and Micromachined Variable Capacitor," *Solid–State Sensor and Actuator Workshop*, Hilton Head Island, South Carolina, Jun. 8–11, 1998, pp. 128–131.

A. Boifot et al., "Evaluation of Different MMIC VCO Design Approaches," *Proceedings of the European Microwave Conference*, London, Sep. 4–7, 1989, Tunbridge Wells, Microwave Exhibitions, GB, vol. CONF. 19, Sep. 4–7, 1989, pp. 1003–1008.

N. Popovic, "Review of Some Types of Varactor Tuned DROs," *Applied Microwave & Wireless*, Aug. 1999, pp. 62–70.

J.–B. Yoon et al., "A High–Q Tunable Micromechanical Capacitor With Movable Dielectric for RF Applications," *IEEE*, 2000, 4 pgs.

A. Megej et al., "Fully Monolithically Integrated Feedback Voltage Controlled Oscillator," *Institut für Hochfrequenztechnik*, TUD, pp. 17–19.

A. Megej et al., "Active Biasing Technique for Compact Wide–Band Voltage Controlled Oscillators," *Institut für Hochfrequenztechnik*, TUD, pp. 20–22.

* cited by examiner

VOLTAGE CONTROLLED OSCILLATORS INCLUDING TUNABLE DIELECTRIC DEVICES

CROSS REFERENCE TO RELATED APPLICATION

This application claims the benefit of U.S. Provisional Application Serial No. 60/219,567, filed Jul. 20, 2000.

BACKGROUND OF THE INVENTION

This invention relates to voltage controlled oscillators, and more particularly, to voltage controlled oscillators that include tunable dielectric devices.

Communication systems are in need of low phase noise, high frequency, higher power and low cost voltage controlled oscillators (VCOs) for use in transmit/receive modules. VCOs are typically used for local oscillators to perform frequency up or down conversions. At higher frequencies, the phase noise of a local oscillator becomes increasingly important for recovering base band signals with minimized distortions. A high performance voltage controlled oscillator (VCO) requires resonant components to be high in Q value.

VCOs utilizing mechanically tuned dielectric resonators are known in the art. Examples of such VCOs can be found in U.S. Pat. Nos. 4,639,690 and 5,578,969. Diode varactors have been used in VCOs at lower frequencies. Examples of such VCOs can be found in U.S. Pat. Nos. 5,233,319 and 5,982,244. However, at microwave frequencies diode varactors become lossy and introduce noise.

While various voltage controlled oscillator topologies are known in the art, there remains a need to provide VCOs that can operate at high frequencies and provide both lower phase noise and wider tuning bandwidth. This invention seeks to fulfill that need.

SUMMARY OF THE INVENTION

Voltage controlled oscillators constructed in accordance with this invention include an active element having a first connection point for connection to a voltage source and an output connection point. A tunable resonator including a first voltage tunable dielectric device is connected to an input of the active element. A first circuit branch is also connected to the active element. A control voltage is applied to the voltage tunable dielectric device to control the frequency of an oscillating voltage at the output connection point. In a reflect type voltage controlled oscillator, the first circuit branch is a bypass circuit. In a transmission type voltage controlled oscillator, the first circuit branch includes a phase shifter and is connected between the active element output connection point and the tunable resonator.

The first circuit branch can include a second voltage tunable dielectric device, in which case a control voltage can also be applied to the second voltage tunable dielectric device to control the frequency of an oscillating voltage at the output connection point.

The voltage controlled oscillators of this invention can include a high Q resonant circuit that provides both improved low phase noise and wide tuning bandwidth. These VCOs can operate in high power applications, while employing a low cost, high Q, linear dielectric tunable capacitor or a low loss phase shifter with effectively no power consumption. These VCOs typically have a phase noise of less than −75 dBc/Hz at 10 KHz offset from microwave carrier frequency and a tuning bandwidth of up to 50%. The tunable components can be fabricated or printed on a single substrate or integrated in a single device.

These and other features and advantages of the present invention will become apparent in the following detailed description of illustrative embodiments thereof, which is to be read in connection with the accompanying drawings.

DESCRIPTION OF THE PREFERRED EMBODIMENTS

Figure 1:
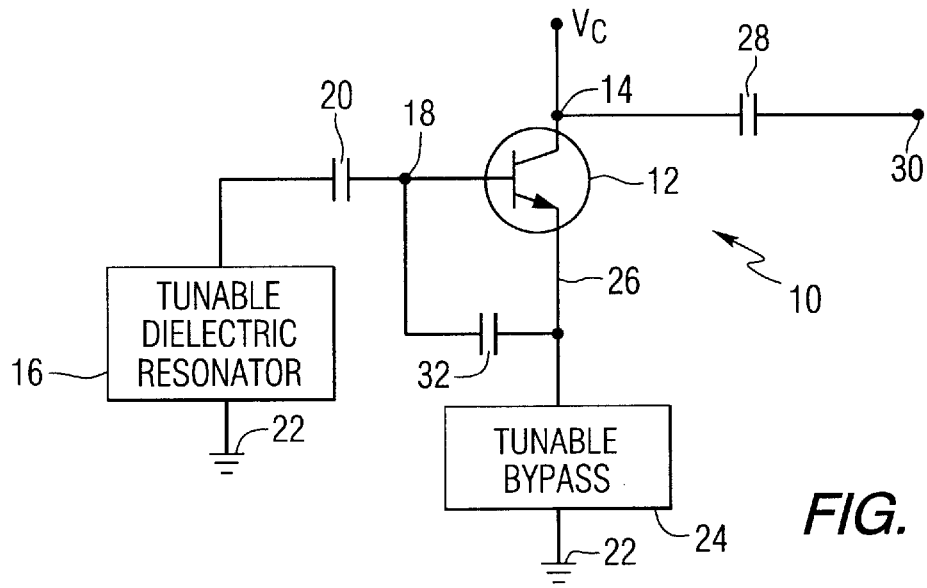
FIG. 1 is a schematic diagram of a reflect-type VCO that uses a tunable dielectric resonator.

Referring to the drawings, FIG. 1 is a schematic diagram of a reflect-type voltage controlled oscillator (VCO) 10 constructed in accordance with the present invention. The VCO includes an active element 12, which in this embodiment comprises a silicon bipolar transistor. Alternative active elements, such as a gallium arsenide field effect transistor (GaAs FET) can be used. However at high frequencies GaAs FETs tend to have a noisier nature due to surface current. For better phase noise performance a bipolar transistor is preferred. The active element 12 includes a connection point 14 for connection to an external voltage source supplying voltage $V_c$. A tunable dielectric resonator 16 is coupled to the transistor base 18 through capacitor 20 and is also connected to a common point 22. A tunable bypass circuit 24 is connected between the transistor emitter 26 and the common point 22. Another capacitor 28 couples the transistor collector to an output terminal 30. A capacitor 32 is also connected between the transistor base and emitter.

Figure 2:
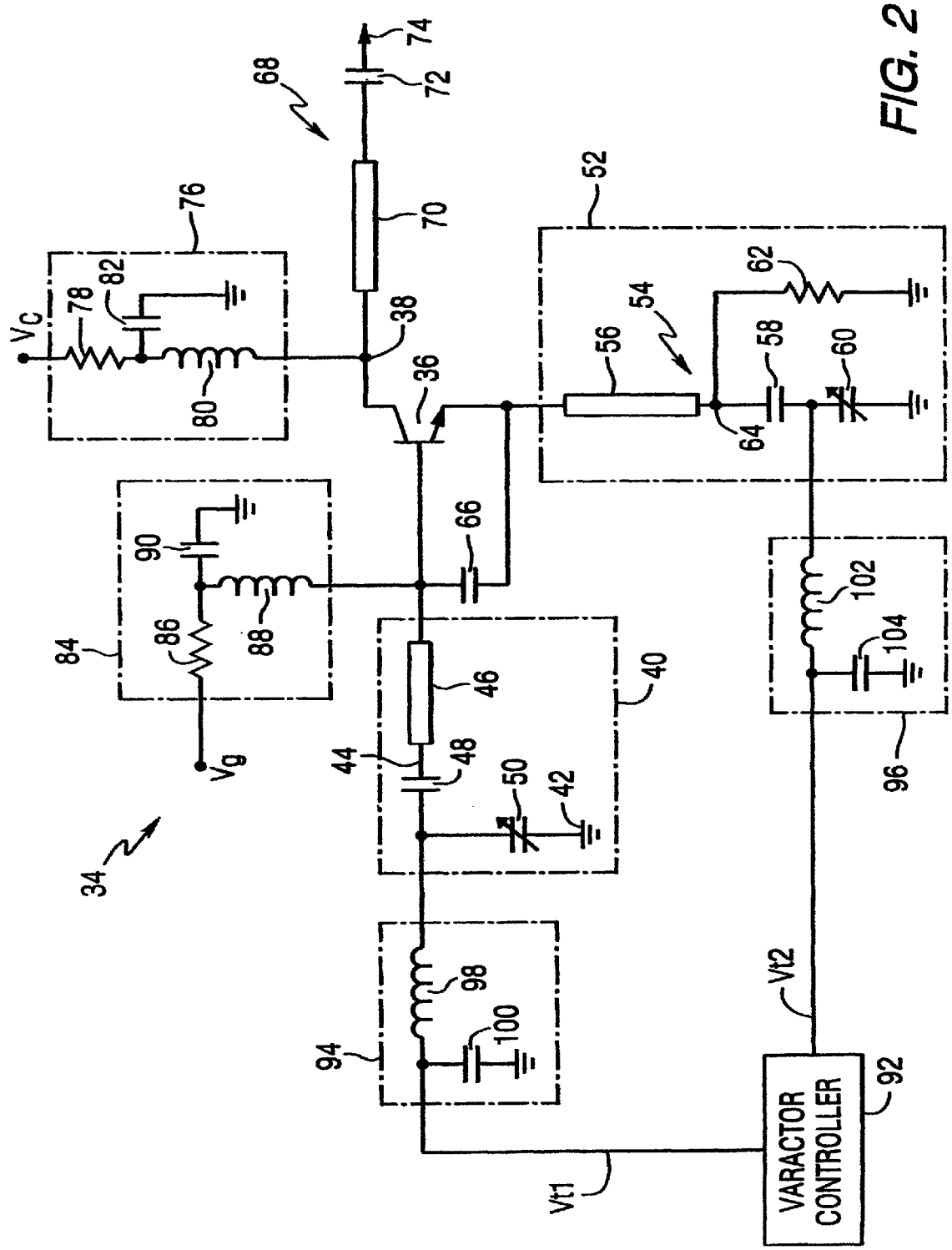
FIG. 2 is a schematic diagram of a reflect-type VCO that uses a tunable dielectric capacitor in the resonator.

FIG. 2 is a more detailed schematic diagram of a reflect-type voltage controlled oscillator (VCO) 34 constructed in accordance with the present invention. The VCO 34 includes an active element 36, which in this embodiment comprises a silicon bipolar transistor as in FIG. 1, and includes a connection point 38 for connection to an external voltage source. A tunable dielectric resonator 40 is connected between the transistor base and a common point 42. The tunable dielectric resonator 40 includes a first circuit branch 44 that includes a series connection of microstrip line 46, capacitor 48 and tunable capacitor 50, which is preferably a tunable dielectric varactor.

A tunable bypass circuit 52 is connected between the transistor emitter and a common point 42. The tunable bypass circuit 52 includes a first circuit branch 54 that includes a series connection of microstrip line 56, capacitor 58 and tunable capacitor 60, which is preferably a tunable dielectric varactor. A resistor 62 is connected between a node 64 between the microstrip line 56 and capacitor 58 and the common point 42.

A capacitor 66 is connected between the transistor base and emitter. A circuit branch 68, comprising the series connection of a microstrip line 70 and a capacitor 72 connects the transistor collector to an output terminal 74.

Transistor collector voltage $V_c$ is supplied through a bias voltage circuit 76 including resistor 78, inductor 80 and capacitor 82. Inductor 80 and capacitor 82 form a filter, or choke, that provides DC isolation. Transistor base voltage Vg is supplied through a bias voltage circuit 84 including resistor 86, inductor 88 and capacitor 90. Inductor 88 and capacitor 90 form a choke that provides DC isolation.

A tuning controller 92 is used to supply tuning voltage to the tunable dielectric varactors 50 and 60. DC isolation circuits 94 and 96 are used to couple the tuning controller 92 to the tunable dielectric devices 50 and 60 respectively. Isolation circuit 94 includes inductor 98 and capacitor 100, while isolation circuit 96 includes inductor 102 and capacitor 104. The resonator circuit 40 forms a negative differential resistance device. The biasing circuits provide the transistor base and collector with operating voltages.

Microwave transistors that can be used in the oscillators of FIGS. 1 or 2 are preferably low noise microwave transistors, for example, low phase noise silicon bipolar transistors. The biasing voltages are based on the noise performance and power efficiency. The optimized biasing circuits include filters to isolate the DC from the RF signal path.

The capacitor tuning controller preferably includes a tuning control circuit that can track tuning voltages and keep the tunable capacitors biased under optimized conditions.

In a microwave VCO, after the transistor is chosen, the phase noise performance is controlled by the resonant circuit. In the preferred embodiment of FIG. 2, the resonant circuit 40 is a distributed circuit in which the inductor is a microstrip line 46, and the capacitor is a tunable dielectric varactor 50. Therefore the Q value of the varactor is the key factor affecting the performance of the reflect-type oscillator.

The present invention takes advantage of the characteristics of voltage tunable dielectric material to build low cost, tunable resonators with linear behavior, negligible power consumption, and a high Q value for VCO applications. In the VCO of FIG. 2 a silicon transistor can be used for the oscillator to operate around 9 GHz. A resonator 40 including a varactor 50 and a microstrip line inductor 46 is connected to the transistor base to set the oscillating frequency, and the positive feedback circuit 52 connected to the transistor emitter forms a negative differential resistance. The oscillating frequency can be adjusted by controlling tuning voltages applied to the voltage tunable dielectric varactors in the resonator and the positive feedback circuit. There are two tuning mechanisms in the VCO, the transistor base side is tuned by voltage Vt1, and the negative differential resistance bypass circuit connected to the transistor emitter is tuned by voltage Vt2.

As the control voltages are varied, the capacitance of the tunable capacitors also varies. The frequency of oscillation, ω, is dependent on the reactance, X, of the circuit, which may be stated as:

$$X = \omega L - \frac{1}{\omega C} \text{ and } C = \frac{C48 * C50}{C48 + C50} \text{ or } C = \frac{C58 * C60}{C58 + C60},$$

where the numbers after the capacitance C refer to the item number of the capacitors in FIG. 2. The inductance L is the inductance of the microstrip line 46 or 56 circuit. The tuning voltages can track each other for the best performance. All the DC voltages are supplied through a choke that provides isolation between the DC control voltage and the high frequency signals in the circuit. Vt1 and Vt2 are typically different voltages that are controlled by the controller to achieve optimum operation of the oscillator. In some applications, a circuit branch comprising a fixed resistor and capacitor can replace the tunable bypass circuit 24 in FIG. 1 if performance criteria can be satisfied. This will simplify the bias voltage structure.

Figure 3:
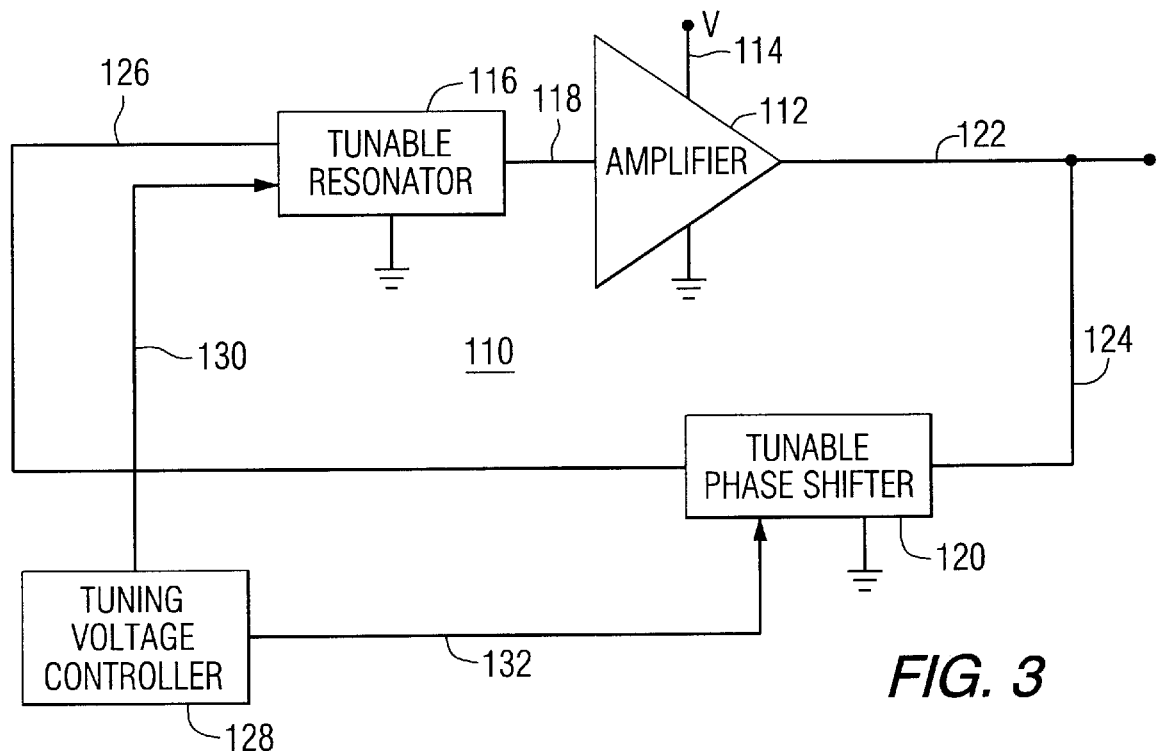
FIG. 3 is a simplified diagram of a transmission type VCO that uses a tunable dielectric resonator and a phase shifter to provide positive feedback.

In an alternative embodiment of the invention, the same technology can be used to build a tunable phase shifter with low losses and wide phase shifting for a transmission type of VCO application. FIG. 3 is a schematic diagram of a transmission type voltage controlled oscillator 110 constructed in accordance with an alternative embodiment of the present invention. VCO 110 includes an amplifier 112 having a connection point 114 for connection to an external voltage source, a tunable resonator circuit 116 connected to the input 118 of the amplifier, and a tunable phase shifter 120 connected between the amplifier output 122 by line 124 and the resonator circuit by line 126, for introducing positive feedback. The tunable resonator 116 may include a dielectric tunable capacitor and microstrip line inductor, similar to those shown in the resonator 40 of FIG. 2. A tuning voltage controller 128 provides a DC tuning control voltage to tunable devices in the tunable resonator 116 by line 130 and phase shifter 120 by line 132.

A tunable dielectric phase shifter is used in the transmission type voltage controlled oscillator of FIG. 3 to obtain low phase noise, high power, a wide selection in frequency tuning range, and low cost. FIG. 3 shows a feedback transmission type oscillator including a dielectric tuned resonator and a dielectric tuned phase shifter. The feedback loop generates a 180-degree phase shift from the amplifier output port back to amplifier input that establishes a necessary and sufficient condition for oscillation. In the resonator, a dielectric tunable capacitor is chosen to control the resonator frequency with tunability ranging from 5 to 50% depending upon the tuning frequency range requirement. The dielectric phase shifter is chosen to have a 180-degree phase shift in the feedback loop, and to synchronously track the feedback phase shift needed by the resonator for oscillation. Once the VCO active component, such as a transistor, has been chosen, the phase noise performance is solely determined by the Q of the tunable resonator. The tunable dielectric varactor in the resonator can be constructed using a tunable material in many different forms such as a tunable bulk material, a thick film, or a thin film in a planer, waveguide or cavity device etc.

Figure 4:
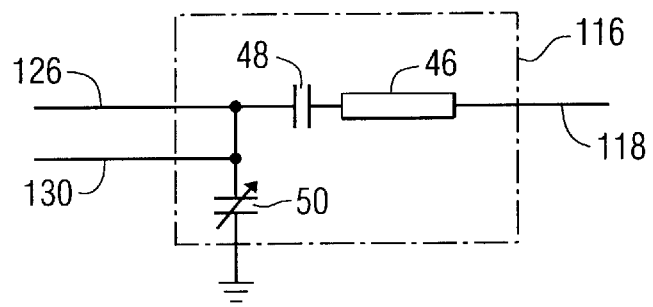
FIG. 4 is a schematic diagram of the tunable dielectric resonator of the transmission type VCO of FIG. 3.

FIG. 4 is a schematic diagram of the tunable resonator 116 of FIG. 3. The tunable dielectric resonator 116 includes a first circuit branch that includes a series connection of microstrip line 46, capacitor 48 and tunable capacitor 50.

The embodiment of FIG. 3 includes a linear dielectric tunable resonator and utilizes a tunable dielectric phase shifter in a positive feedback circuit, both of which employ voltage tunable dielectric material. When a DC tuning voltage is applied to the tunable resonator, the dielectric constant of the material changes, thereby changing the resonant frequency. In the phase shifter, the DC tuning voltage causes the group velocity change, thereby producing a phase shift. The change is approximately linear with a change in tuning voltage. A VCO controller can synchronize the tuning of resonant circuit frequency with a feedback phase shift to achieve a specific oscillation frequency with high Q and low phase noise. By choosing a high tunability tunable capacitor in the resonator, the VCO will have a low phase noise and a wide tuning bandwidth.

The VCO of FIG. 3, can provide an oscillator that operates at around 9 GHz with a 20% bandwidth. The positive feedback circuit sets the phase needed for self-excitation. The phase shifter can be made from tunable material in bulk, thick film or thin film form, in various microstrip, coplanar, or waveguide structures. Depending upon frequency and power handling requirements, a preferred embodiment waveguide phase shifter can operate in Ka-band with a small insertion loss and high power handling capability. The phase shifter provides about a 180-degree phase shift and another 180-degree phase shift results from signal being inverted through the amplifier. The 360-degree phase shifted signal is then excited by the resonator at the amplifier input. The DC voltage bias controller is used to track the optimized bias condition for each tunable device. By tuning and tracking the resonant circuit and the bypass circuit, the oscillator can achieve optimized performance. The tuning voltage controller can be a computer controlled or micro-controller chip controlled power supply that can simultaneously execute multiple tasks, and which also can be manually adjusted. The controller sets the bias voltage according to the optimized data, and ensures that the VCO achieves the best performance. The amplifier can include a 50 ohm matched network that rejects the undesired frequency band.

Figure 5:
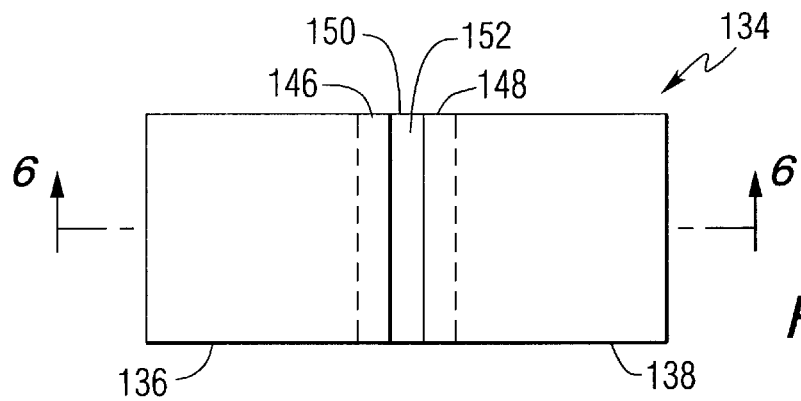
FIG. 5 is a top plan view of a tunable dielectric varactor that can be used in the phase shifters of the present invention.
Figure 6:
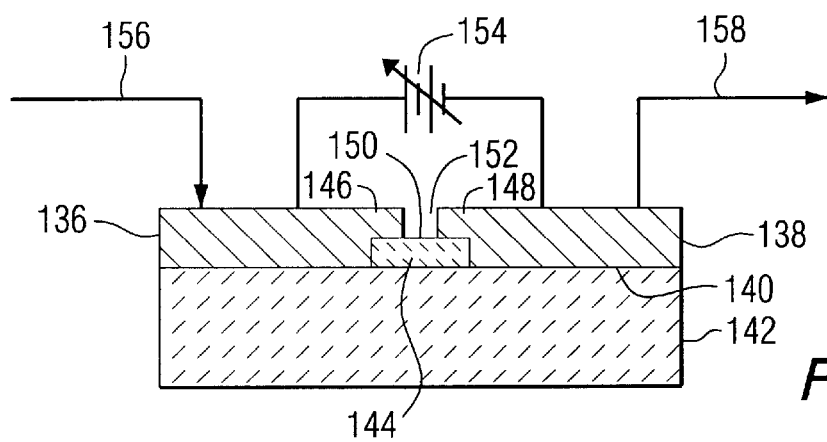
FIG. 6 is a cross sectional view of the tunable dielectric varactor of FIG. 5 taken long line 6—6.

This invention can utilize varactors, which include a low loss, tunable dielectric material having high tuning capabilities, such as a barium strontium titanate (BST) based composite film. FIG. 5 is a top plan view of a dielectric varactor 134 that can be used in the phase shifters of the present invention. FIG. 6 is a cross sectional view of the dielectric varactor of FIG. 5 taken along line 6—6. The dielectric varactor 134 includes two planar electrodes 136 and 138 mounted on a surface 140 of a substrate 142. A film of tunable dielectric material 144 is also positioned in the surface of the substrate. Portions 146 and 148 of electrodes 136 and 138 respectively, extend over a surface 150 of the tunable dielectric material and are separated to form a predetermined gap 152. The substrate can, for example, comprise MgO, alumna ($AL_2O_3$), $LaAlO_3$, sapphire, quartz, silicon, gallium arsenide, and other compatible materials to the tunable films and their processing. A voltage supplied by an external variable DC voltage source 154 produces an electric field across the gap adjacent to the surface of the tunable dielectric material, which produces an overall change in the capacitance of the varactor. The width of the gap can range from 10 to 40 $\mu$m depending on the performance requirements. An input 156 is connected to the first electrode 136 and an output 158 is connected to the second electrode 138. The electrodes are constructed of conducting materials, for example, gold, silver, copper, platinum, ruthenium oxide or other compatible conducting materials to the tunable films.

Figure 7:
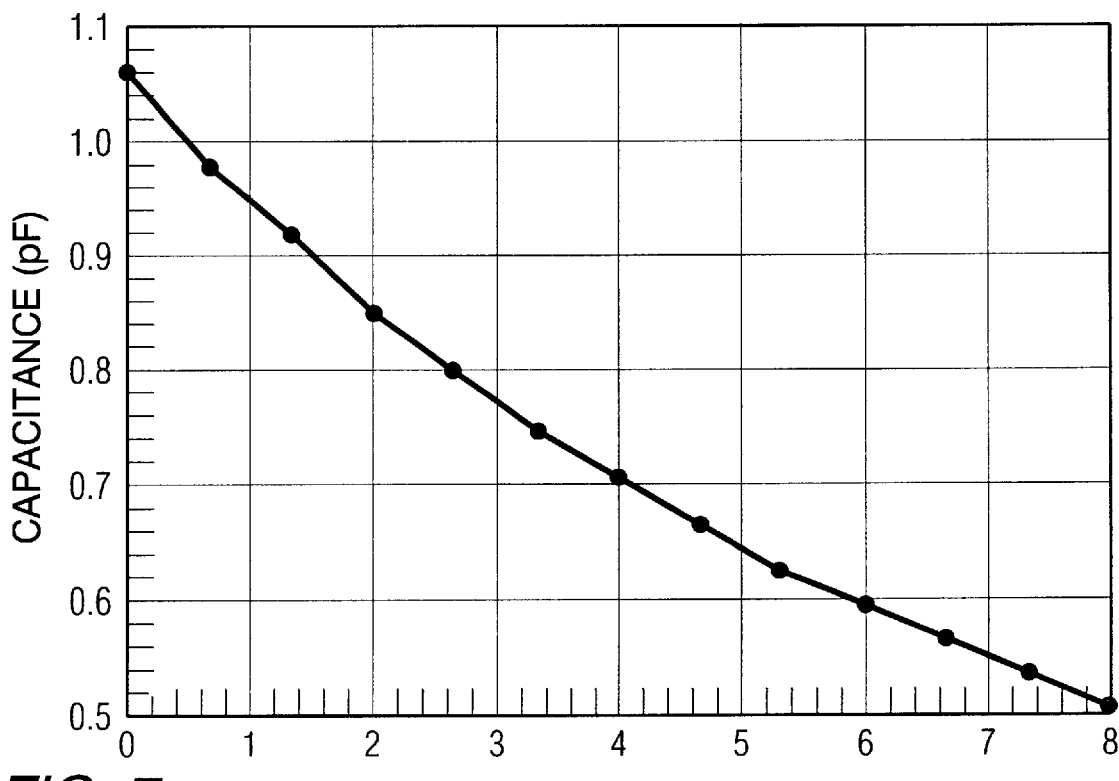
FIG. 7 is a graphical representation of the capacitance of a tunable dielectric capacitor as a function of an applied electric field strength.

FIG. 7 is a graph illustrating the linear behavior of a tunable capacitor that may be used in the invention. The voltage is proportional to the thickness of the material. In microwave frequencies, the tunable capacitor can include a thick film tunable dielectric material, or a thin film tunable dielectric material that makes the tuning voltage lower.

Figure 8:
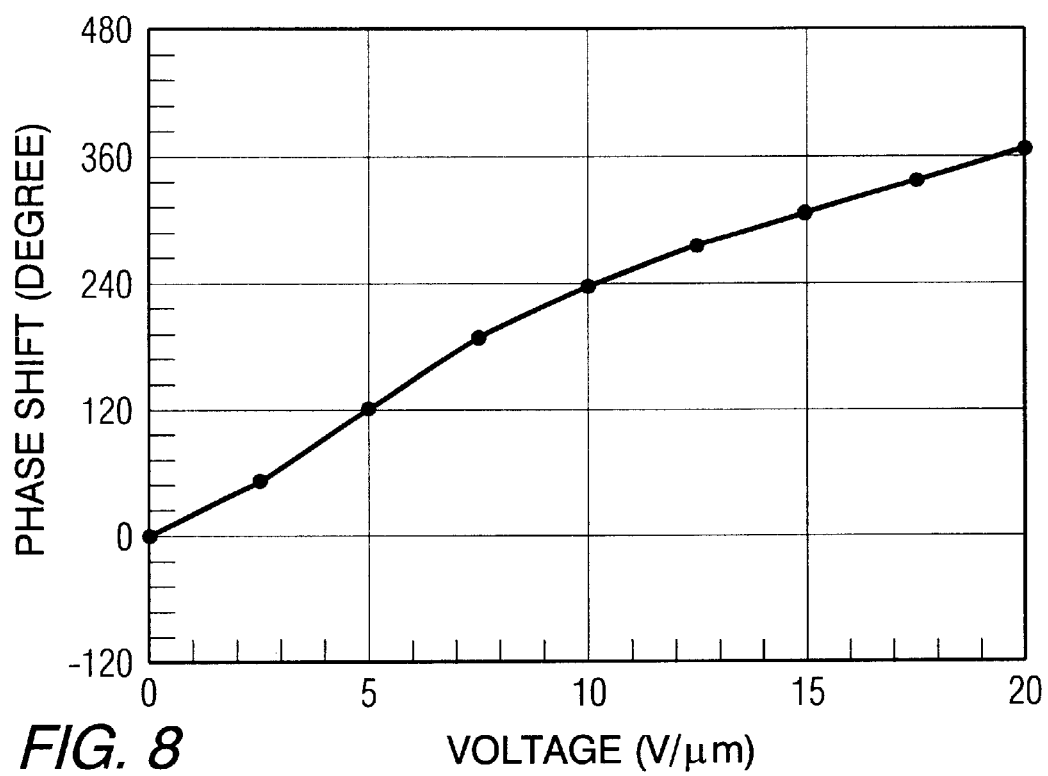
FIG. 8 is a graphical representation of the phase shift of the tunable dielectric phase shifter as a function of an applied electric field strength.

FIG. 8 shows the linear phase shift versus the tuning voltage for a tunable dielectric phase shifter of a type that can be used in the VCO's of this invention. The phase shifter can be designed to provide a phase shift of about 180 degrees, with tuning of plus and minus 90-degrees. When the desired frequency changes, tuning of the tunable capacitor in the resonant circuit and tuning of the phase shifter will track each other and adjust synchronously to achieve the optimized performance.

Figure 9:
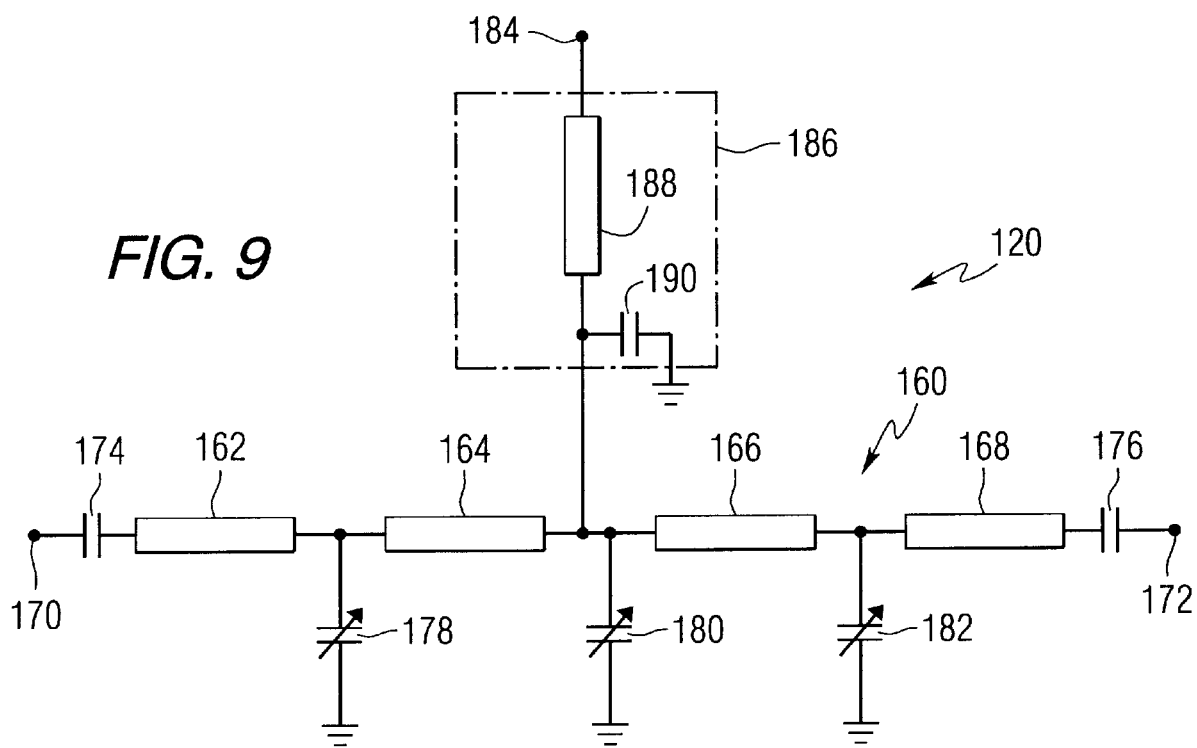
FIG. 9 is a simplified diagram of a loaded line phase shifter the utilizes tunable dielectric capacitors.

FIG. 9 is a schematic representation of an X-band loaded line phase shifter that can be used as the tunable phase shifter 120 in FIG. 3, and provides a combination of shifted phase plus phase delay using fixed transmission lines to achieve a 180-degree phase shift. The phase shifter includes a microstrip line 160 including the series connection of line segments 162, 164, 166 and 168. The line is connected to an input 170 and an output 172 through capacitors 174 and 176 respectively. Tunable varactors 178, 180 and 182 are connected between intermediate points on the line and ground. The capacitance of the varactors is controlled by supplying a bias voltage to terminal 184 through a choke 186 that includes a microstrip line 188 and capacitor 190.

In operation, both the reflect and the transmission type VCO are similar in principle, in that VCO is self excited by a feedback signal phase added to boost its amplitude. The reflect-type may be easier to excite in different frequency regions while the transmission type tends to have single oscillation frequency.

The tunable dielectric varactors that can be used in this invention can be constructed in accordance with the varactor structures shown in commonly owned U.S. patent applications Ser. No. 09/419,126, filed Oct. 15, 1999 (PCT/US99/24161); Ser. No. 09/434,433, now U.S. Pat. No. 6,531,936, filed Nov. 4, 1999 (PCT/US99/26113); or Ser. No. 09/660,309, now U.S. Pat. No. 6,377,440, filed Sep. 12, 2000, all of which are incorporated by reference. The phase shifter can be constructed in accordance with the phase shifter structures shown in commonly owned U.S. patent applications Ser. No. 09/644,019, filed Aug. 22, 1999 (PCT/US00/23023) or Ser. No. 09/847,256, filed May 2, 2001, 2001 (PCT/US01/13638), both of which are incorporated by reference.

The preferred embodiments of this invention provide high performance and small size VCOs that include varactors or phase shifters utilizing tunable dielectric material for wireless communication, especially for mobile and portable wireless communications, as well as other applications.

Tunable dielectric materials have been described in several patents. Barium strontium titanate ($BaTiO_3$—$SrTiO_3$), also referred to as BSTO, is used for its high dielectric constant (200–6,000) and large change in dielectric constant with applied voltage (25–75 percent with a field of 2 Volts/micron). Tunable dielectric materials including barium strontium titanate are disclosed in U.S. Pat. No. 5,427,988 by Sengupta, et al. entitled "Ceramic Ferroelectric Composite Material-BSTO-MgO"; U.S. Pat. No. 5,635,434 by Sengupta, et al. entitled "Ceramic Ferroelectric Composite Material-BSTO-Magnesium Based Compound"; U.S. Pat. No. 5,830,591 by Sengupta, et al. entitled "Multilayered Ferroelectric Composite Waveguides"; U.S. Pat. No. 5,846,893 by Sengupta, et al. entitled "Thin Film Ferroelectric Composites and Method of Making"; U.S. Pat. No. 5,766,697 by Sengupta, et al. entitled "Method of Making Thin Film Composites"; U.S. Pat. No. 5,693,429 by Sengupta, et al. entitled "Electronically Graded Multilayer Ferroelectric Composites"; U.S. Pat. No. 5,635,433 by Sengupta entitled "Ceramic Ferroelectric Composite Material BSTO-ZnO"; U.S. Pat. No. 6,074,971 by Chiu et al. entitled "Ceramic Ferroelectric Composite Materials with Enhanced Electronic Properties BSTO-Mg Based Compound-Rare Earth Oxide". These patents are incorporated herein by reference.

The electronically tunable materials that can be used in the varactors or phase shifters used in the preferred embodiments of the present invention include at least one electronically tunable dielectric phase, such as barium strontium titanate, in combination with at least two additional metal oxide phases. Barium strontium titanate of the formula $Ba_xSr_{1-x}TiO_3$ is a preferred electronically tunable dielectric material due to its favorable tuning characteristics, low Curie temperatures and low microwave loss properties. In the formula $Ba_xSr_{1-x}TiO_3$, x can be any value from 0 to 1, preferably from about 0.15 to about 0.6. More preferably, x is from 0.3 to 0.6.

Other electronically tunable dielectric materials may be used partially or entirely in place of barium strontium titanate. An example is $Ba_xCa_{1-x}TiO_3$, where x is in a range from about 0.2 to about 0.8, preferably from about 0.4 to about 0.6. Additional electronically tunable ferroelectrics include $Pb_xZr_{1-x}TiO_3$ (PZT) where x ranges from about 0.05 to about 0.4, lead lanthanum zirconium titanate (PLZT), $PbTiO_3$, $BaCaZrTiO_3$, $NaNO_3$, $KNbO_3$, $LiNbO_3$, $LiTaO_3$, $PbNb_2O_6$, $PbTa_2O_6$, $KSr(NbO_3)$ and $NaBa_2(NbO_3)$ $5KH_2PO_4$.

In addition, the following U.S. Patent Applications, assigned to the assignee of this application, disclose additional examples of tunable dielectric materials: U.S. application Ser. No. 09/594,837 filed Jun. 15, 2000, entitled "Electronically Tunable Ceramic Materials Including Tunable Dielectric and Metal Silicate Phases"; U.S. application Ser. No. 09/768,690 filed Jan. 24, 2001, entitled "Electronically Tunable, Low-Loss Ceramic Materials Including a Tunable Dielectric Phase and Multiple Metal Oxide Phases"; U.S. application Ser. No. 09/882,605 filed Jun. 15, 2001, entitled "Electronically Tunable Dielectric Composite Thick Films And Methods Of Making Same"; and U.S. Provisional Application Ser. No. 60/295,046 filed Jun. 1, 2001 entitled "Tunable Dielectric Compositions Including Low Loss Glass Frits". These patent applications are incorporated herein by reference.

The tunable dielectric materials can also be combined with one or more non-tunable dielectric materials. The non-tunable phase(s) may include MgO, $MgAl_2O_4$, $MgTiO_3$, $Mg_2SiO_4$, $CaSiO_3$, $MgSrZrTiO_6$, $CaTiO_3$, $Al_2O_3$, $SiO_2$ and/or other metal silicates such as $BaSiO_3$ and $SrSiO_3$. The non-tunable dielectric phases may be any combination of the above, e.g., MgO combined with $MgTiO_3$, MgO combined with $MgSrZrTiO_6$, MgO combined with $Mg_2SiO_4$, MgO combined with $Mg_2SiO_4$, $Mg_2SiO_4$ combined with $CaTiO_3$ and the like.

Additional minor additives in amounts of from about 0.1 to about 5 weight percent can be added to the composites to additionally improve the electronic properties of the films. These minor additives include oxides such as zirconnates, tannates, rare earths, niobates and tantalates. For example, the minor additives may include $CaZrO_3$, $BaZrO_3$, $SrZrO_3$, $BaSnO_3$, $CaSnO_3$, $MgSnO_3$, $Bi_2O_3/2SnO_2$, $Nd_2O_3$, $Pr_7O_{11}$, $Yb_2O_3$, $Ho_2O_3$, $La_2O_3$, $MgNb_2O_6$, $SrNb_2O_6$, $BaNb_2O_6$, $MgTa_2O_6$, $BaTa_2O_6$ and $Ta_2O_3$.

Thick films of tunable dielectric composites can comprise $Ba_{1-x}Sr_xTiO_3$, where x is from 0.3 to 0.7 in combination with at least one non-tunable dielectric phase selected from MgO, $MgTiO_3$, $MgZrO_3$, $MgSrZrTiO_6$, $Mg_2SiO_4$, $CaSiO_3$, $MgAl_2O_4$, $CaTiO_3$, $Al_2O_3$, $SiO_2$, $BaSiO_3$ and $SrSiO_3$. These compositions can be BSTO and one of these components or two or more of these components in quantities from 0.25 weight percent to 80 weight percent with BSTO weight ratios of 99.75 weight percent to 20 weight percent.

The electronically tunable materials can also include at least one metal silicate phase. The metal silicates may include metals from Group 2A of the Periodic Table, i.e., Be, Mg, Ca, Sr, Ba and Ra, preferably Mg, Ca, Sr and Ba. Preferred metal silicates include $Mg_2SiO_4$, $CaSiO_3$, $BaSiO_3$ and $SrSiO_3$. In addition to Group 2A metals, the present metal silicates may include metals from Group 1A, i.e., Li, Na, K, Rb, Cs and Fr, preferably Li, Na and K. For example, such metal silicates may include sodium silicates such as $Na_2SiO_3$ and $NaSiO_3$-$5H_2O$, and lithium-containing silicates such as $LiAlSiO_4$, $Li_2SiO_3$ and $Li_4SiO_4$. Metals from Groups 3A, 4A and some transition metals of the Periodic Table may also be suitable constituents of the metal silicate phase. Additional metal silicates may include $Al_2Si_2O_7$, $ZrSiO_4$, $KalSi_3O_8$, $NaAlSi_3O_8$, $CaAl_2Si_2O_8$, $CaMgSi_2O_6$, $BaTiSi_3O_9$ and $Zn_2SiO_4$. Tunable dielectric materials identified as Parascan™ materials, are available from Paratek Microwave, Inc. The above tunable materials can be tuned at room temperature by controlling an electric field that is applied across the materials.

In addition to the electronically tunable dielectric phase, the electronically tunable materials can include at least two additional metal oxide phases. The additional metal oxides may include metals from Group 2A of the Periodic Table, i.e., Mg, Ca, Sr, Ba, Be and Ra, preferably Mg, Ca, Sr and Ba. The additional metal oxides may also include metals from Group 1A, i.e., Li, Na, K, Rb, Cs and Fr, preferably Li, Na and K. Metals from other Groups of the Periodic Table may also be suitable constituents of the metal oxide phases. For example, refractory metals such as Ti, V, Cr, Mn, Zr, Nb, Mo, Hf, Ta and W may be used. Furthermore, metals such as Al, Si, Sn, Pb and Bi may be used. In addition, the metal oxide phases may comprise rare earth metals such as Sc, Y, La, Ce, Pr, Nd and the like.

The additional metal oxides may include, for example, zirconnates, silicates, titanates, aluminates, stannates, niobates, tantalates and rare earth oxides. Preferred additional metal oxides include $Mg_2SiO_4$, MgO, $CaTiO_3$, $MgZrSrTiO_6$, $MgTiO_3$, $MgAl_2O_4$, $WO_3$, $SnTiO_4$, $ZrTiO_4$, $CaSiO_3$, $CaSnO_3$, $CaWO_4$, $CaZrO_3$, $MgTa_2O_6$, $MgZrO_3$, $MnO_2$, PbO, $Bi_2O_3$ and $La_2O_3$. Particularly preferred additional metal oxides include $Mg_2SiO_4$, MgO, $CaTiO_3$, $MgZrSrTiO_6$, $MgTiO_3$, $MgAl_2O_4$, $MgTa_2O_6$ and $MgZrO_3$.

The additional metal oxide phases may alternatively include at least two Mg-containing compounds. In addition to the multiple Mg-containing compounds, the material may optionally include Mg-free compounds, for example, oxides of metals selected from Si, Ca, Zr, Ti, Al and/or rare earths. In another embodiment, the additional metal oxide phases may include a single Mg-containing compound and at least one Mg-free compound, for example, oxides of metals selected from Si, Ca, Zr, Ti, Al and/or rare earths.

While the present invention has been described in terms of what are at present its preferred embodiments, it will be apparent to those skilled in the art that various modifications can be made to the disclosed embodiments without departing from the scope of this invention s set forth in the following claims.

What is claimed is:

1. A voltage controlled oscillator comprising:

a transistor having a first connection point for connection to a voltage source and an output connection point;

a tunable resonator including a first voltage tunable dielectric device, the tunable resonator is connected between a first terminal of the transistor and a common point;

a first circuit branch including a second voltage tunable dielectric device, the first circuit branch is connected between a second terminal of the transistor and the common point; and a tuning voltage controller for supplying a control voltage to the first voltage tunable dielectric device to control the frequency of an oscillating voltage at the output connection point, the voltage controlled oscillator further comprising:
  a first DC isolation circuit connected between the tuning voltage controller and the first voltage tunable dielectric device; and
  a second DC isolation circuit connected between the tuning voltage controller and the second voltage tunable dielectric device.

2. A voltage controlled oscillator according to claim 1, wherein the each of the first and second voltage tunable dielectric devices comprises:
  a tunable dielectric varactor.

3. A voltage controlled oscillator according to claim 1, wherein the first circuit branch comprises:
  a resistor and a capacitor electrically connected in series with each other.

4. A voltage controlled oscillator according to claim 1, wherein the transistor comprises:
  a silicon bipolar transistor, the first terminal is a base of the transistor, and the second terminal is an emitter of the transistor.

5. A voltage controlled oscillator comprising:
  an active element having a first connection point for connection to a voltage source and an output connection point;
  a tunable resonator including a first microstrip line connected in series with a first voltage tunable dielectric device, the tunable resonator connected to an input of the active element;
  a first circuit branch including a second microstrip line connected in series with a second voltage tunable dielectric device, the first circuit branch connected to the active element; and
  a tuning voltage controller for supplying a control voltage to the first voltage tunable dielectric device to control the frequency of an oscillating voltage at the output connection point, wherein the tuning voltage controller also supplies a second control voltage to the second voltage tunable dielectric device, the voltage controlled oscillator further comprising:
  a first DC isolation circuit connected between the tuning voltage controller and the first tunable dielectric device; and
  a second DC isolation circuit connected between the tuning voltage controller and the second tunable dielectric device.

6. A voltage controlled oscillator according to claim 1, further comprising an output circuit connected between the output connection point of the transistor and an output terminal, wherein the output circuit comprises a circuit branch including a microstrip line and a capacitor.

7. A voltage controlled oscillator comprising:
  an amplifier having a first connection point for connection to a voltage source and an output connection point;
  a tunable resonator including a first voltage tunable dielectric device, the tunable resonator is connected between an input of the amplifier and a common point;
  a phase shifter including a second voltage tunable dielectric device, the phase shifter is connected between an output of the amplifier and the tunable resonator; and
  a tuning voltage controller for supplying a control voltage to the first voltage tunable dielectric device to control the frequency of an oscillating voltage at the output connection point, the voltage controlled oscillator further comprising:
  a first DC isolation circuit connected between the tuning voltage controller and the first voltage tunable dielectric device; and
  a second DC isolation circuit connected between the tuning voltage controller and the second voltage tunable dielectric device.

8. A voltage controlled oscillator according to claim 7, wherein the tunable resonator circuit comprises:
  a first microstrip line connected in series with the first tunable dielectric device.

9. A voltage controlled oscillator according to claim 8, wherein the first voltage tunable dielectric device comprises:
  a tunable dielectric varactor.

10. A voltage controlled oscillator according to claim 7, wherein the phase shifter comprises:
  a loaded line phase shifter including a plurality of microstrip line segments electrically connected in series with each other and the second voltage tunable dielectric device connected between a node between the microstrip line segments and a common point.

11. A voltage controlled oscillator according to claim 10, wherein each of the first and second voltage tunable dielectric devices comprises:
  a tunable dielectric varactor.

12. A voltage controlled oscillator comprising:
  a transistor having a collector connected to a voltage source and an output connection point;
  a tuning controller;
  a tunable resonator including a first voltage tunable dielectric capacitor, the tunable resonator is connected between the tuning controller and a base of the transistor;
  a tunable bypass circuit including a second voltage tunable dielectric capacitor, the tunable bypass circuit is connected between the tuning controller and an emitter of the transistor;
  said tuning controller is capable of supplying two different tuning voltages, one tuning voltage is supplied to the first voltage tunable dielectric capacitor and the second tuning voltage is supplied to the second voltage tunable dielectric capacitor to control the frequency of an oscillating voltage at the output connection point.

13. The voltage controlled oscillator according to claim 12, wherein said transistor is a silicon bipolar transistor.

14. The voltage controlled oscillator according to claim 12, wherein said tunable resonator includes a first microstrip line connected in series with the first voltage tunable dielectric capacitor.

15. The voltage controlled oscillator according to claim 12, wherein said tunable bypass circuit includes a second microstrip line connected in series with the second voltage tunable dielectric capacitor.

16. The voltage controlled oscillator according to claim 12, further comprising:
  a first DC isolation circuit connected between the tuning controller and the tunable resonator; and
  a second DC isolation circuit connected between the tuning controller and the tunable bypass circuit.

17. The voltage controlled oscillator according to claim 12, further comprising an output circuit connected between the collector of the transistor and an output terminal, wherein the output circuit includes a microstrip line and a capacitor.

18. The voltage controlled oscillator according to claim 12, wherein said first and second voltage tunable dielectric capacitors each include:
   a substrate;
   a layer of tunable dielectric material positioned on a surface of the substrate;
   first and second electrodes; and
   at least a portion of the first and second electrodes positioned adjacent to a surface of the layer of tunable dielectric material and separated to form a gap.

19. The voltage controlled oscillator according to claim 18, wherein said tunable dielectric material includes a material selected from the group of:
   barium strontium titanate, $Ba_xCa_{1-x}TiO_3$, $Pb_xZr_{1-x}TiO_3$, lead lanthanum zirconium titanate, $PbTiO_3$, $BaCaZrTiO_3$, $NaNO_3$, $KNbO_3$, $LiNbO_3$, $LiTaO_3$, $PbNb_2O_6$, $PbTa_2O_6$, $KSr(NbO_3)$ and $NaBa_2(NbO_3)5 KH_2PO_4$.

20. The voltage controlled oscillator according to claim 19, wherein said tunable dielectric material is combined with at least one non-tunable dielectric material selected from the group of:
   $MgO$, $MgAl_2O_4$, $MgTiO_3$, $Mg_2SiO_4$, $CaSiO_3$, $MgZrSrTiO_6$, $CaTiO_3$, $Al2O3$, $SiO_2$, $BaSiO_3$ and $SrSiO_3$.

21. The voltage controlled oscillator according to claim 18, wherein said tunable dielectric material includes at least one metal silicate.

22. The voltage controlled oscillator according to claim 18, wherein said tunable dielectric material includes at least one metal oxide.

23. A voltage controlled oscillator comprising:
   an amplifier connected to a voltage source;
   a tunable resonator including a first voltage tunable dielectric capacitor;
   a tunable phase shifter including a second tunable dielectric capacitor, the tunable phase shifter is connected between an output of the amplifier and the tunable resonator which is connected between an input of the amplifier and the tunable phase shifter; and
   a tuning controller for supplying tuning voltages to the first and second voltage tunable dielectric capacitors to control the frequency of an oscillating voltage at the output of the amplifier, the voltage controlled oscillator further comprising:
      a first DC isolation circuit connected between the tuning voltage controller and the first voltage tunable dielectric capacitor; and
      a second DC isolation circuit connected between the tuning voltage controller and the second voltage tunable dielectric capacitor.

24. The voltage controlled oscillator according to claim 23, wherein said tunable resonator includes a first microstrip line connected in series with the first voltage tunable dielectric capacitor.

25. The voltage controlled oscillator according to claim 23, wherein said tunable phase shifter includes a second microstrip line connected in series with the second voltage tunable dielectric capacitor.

26. The voltage controlled oscillator according to claim 23, wherein said phase shifter includes a loaded line phase shifter including a plurality of microstrip line segments electrically connected in series with each other and a plurality of second voltage tunable dielectric capacitors each of which is connected between two microstrip line segments and a common point.

27. The voltage controlled oscillator according to claim 23, wherein each of the first and second voltage tunable dielectric capacitors include:
   a substrate;
   a layer of tunable dielectric material positioned on a surface of the substrate;
   first and second electrodes; and
   at least a portion of the first and second electrodes positioned adjacent to a surface of the layer of tunable dielectric material and separated to form a gap.

28. The voltage controlled oscillator according to claim 27, wherein said tunable dielectric material includes a material selected from the group of:
   barium strontium titanate, $Ba_xCa_{1-x}TiO_3$, $Pb_xZr_{1-x}TiO_3$, lead lanthanum zirconium titanate, $PbTiO_3$, $BaCaZrTiO_3$, $NaNO_3$, $KNbO_3$, $LiNbO_3$, $LiTaO_3$, $PbNb_2O_6$, $PbTa_2O_6$, $KSr(NbO_3)$ and $NaBa_2(NbO_3)5KH_2PO_4$.

29. The voltage controlled oscillator according to claim 28, wherein said tunable dielectric material is combined with at least one non-tunable dielectric material selected from the group of:
   $MgO$, $MgAl_2O_4$, $MgTiO_3$, $Mg_2SiO_4$, $CaSiO_3$, $MgSrZrTiO_6$, $CaTiO_3$, $Al_2O_3$, $SiO_2$, $BaSiO_3$ and $SrSiO_3$.

30. The voltage controlled oscillator according to claim 27, wherein said tunable dielectric material includes at least one metal silicate.

31. The voltage controlled oscillator according to claim 27, wherein said tunable dielectric material includes at least one metal oxide.

* * * * *